US011132311B2

(12) United States Patent
Minopoli et al.

(10) Patent No.: US 11,132,311 B2
(45) Date of Patent: *Sep. 28, 2021

(54) INTERFACE FOR MEMORY HAVING A CACHE AND MULTIPLE INDEPENDENT ARRAYS

(71) Applicant: Micron Technology, Inc., Boise, ID (US)

(72) Inventors: Dionisio Minopoli, Arzano (IT); Gianfranco Ferrante, San Giorgio a Cremano (IT); Antonino Capri, Bergamo (IT); Emanuele Confalonieri, Lesmo (IT); Daniele Balluchi, Cernusco sul Naviglio (IT)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/702,980

(22) Filed: Dec. 4, 2019

(65) Prior Publication Data
US 2020/0104268 A1    Apr. 2, 2020

Related U.S. Application Data

(63) Continuation of application No. 15/924,917, filed on Mar. 19, 2018, now Pat. No. 10,534,731.

(51) Int. Cl.
*G06F 13/16* (2006.01)
*G06F 3/06* (2006.01)
(Continued)

(52) U.S. Cl.
CPC ........ *G06F 13/1689* (2013.01); *G06F 3/0611* (2013.01); *G06F 3/0659* (2013.01);
(Continued)

(58) Field of Classification Search
CPC .. G06F 13/1689; G06F 13/4234; G06F 13/22; G06F 13/32; G06F 13/161; G06F 13/1621; G06F 9/3869
See application file for complete search history.

(56) References Cited

U.S. PATENT DOCUMENTS 9,740,485 B2    8/2017    Mirichigni et al.
9,754,648 B2    9/2017    Mirichigni et al.
(Continued)

FOREIGN PATENT DOCUMENTS

KR    10-2017-0104115    9/2017

OTHER PUBLICATIONS

International Search Report and Written Opinion for related international application No. PCT/US2019/019066, dated Jun. 4, 2019, 13 pages.

(Continued)

*Primary Examiner* — Ernest Unelus
(74) *Attorney, Agent, or Firm* — Brooks, Cameron & Huebsch, PLLC

(57) ABSTRACT

The present disclosure includes an interface for memory having a cache and multiple independent arrays. An embodiment includes a memory device having a cache and a plurality independent memory arrays, a controller, and an interface configured to communicate a plurality of commands from the controller to the memory device, wherein the interface includes a pin configured to activate upon a first one of the plurality of commands being received by the memory device and deactivate once all of the plurality of commands have been executed by the memory device.

19 Claims, 5 Drawing Sheets

(51) Int. Cl.
  *G11C 11/4096*  (2006.01)
  *G11C 11/4076*  (2006.01)
  *G11C 11/4093*  (2006.01)
  *G06F 13/42*    (2006.01)
  *G06F 13/32*    (2006.01)
  *G06F 13/22*    (2006.01)
  *G06F 9/38*     (2018.01)

(52) U.S. Cl.
  CPC .......... *G06F 3/0683* (2013.01); *G06F 13/161* (2013.01); *G11C 11/4076* (2013.01); *G11C 11/4093* (2013.01); *G11C 11/4096* (2013.01); *G06F 9/3869* (2013.01); *G06F 13/1621* (2013.01); *G06F 13/22* (2013.01); *G06F 13/32* (2013.01); *G06F 13/4234* (2013.01)

(56) References Cited

U.S. PATENT DOCUMENTS

| | | |
|---|---|---|
| 2008/0082766 A1 | 4/2008 | Okin et al. |
| 2010/0217924 A1 | 8/2010 | Panabaker et al. |
| 2013/0262744 A1 | 10/2013 | Ramachandra et al. |
| 2015/0100744 A1* | 4/2015 | Mirichigni .......... G06F 12/0246 711/154 |
| 2016/0188258 A1 | 6/2016 | Nale |
| 2017/0309318 A1 | 10/2017 | Mirichigni et al. |
| 2017/0329707 A1* | 11/2017 | Nemawarkar ...... G06F 12/0868 |

OTHER PUBLICATIONS

Office Action from related Taiwanese patent application No. 108108838, dated Jan. 15, 2020, 14 pages.

* cited by examiner

INTERFACE FOR MEMORY HAVING A CACHE AND MULTIPLE INDEPENDENT ARRAYS

PRIORITY INFORMATION

This application is a continuation of U.S. application Ser. No. 15/924,917, filed on Mar. 19, 2018, the contents of which are incorporated herein by reference.

TECHNICAL FIELD

The present disclosure relates generally to semiconductor memory and methods, and more particularly, to an interface for memory having a cache and multiple independent arrays.

BACKGROUND

Memory devices are typically provided as internal, semiconductor, integrated circuits and/or external removable devices in computers or other electronic devices. There are many different types of memory including volatile and non-volatile memory. Volatile memory can require power to maintain its data and can include random-access memory (RAM), dynamic random access memory (DRAM), static random access memory (SRAM), and synchronous dynamic random access memory (SDRAM), among others. Non-volatile memory can retain stored data when not powered and can include NAND flash memory, NOR flash memory, phase change random access memory (PCRAM), resistive random access memory (RRAM), and magnetic random access memory (MRAM), among others.

A memory device can include a cache memory that may be smaller and/or faster than the other memory of the device (which may be referred to as main memory). As an example, cache memory may comprise DRAM, and main memory may comprise DRAM, NAND or NOR flash memory, disk storage, or solid state drives (SSD). A memory device may utilize cache memory to cache data, which may improve the speed and/or performance of the memory device.

Controllers for existing memory devices, such as, for instance, existing DRAM devices with a multiple array (e.g., multiple bank) architecture, may issue commands, such as program (e.g., write) and sense (e.g., read) commands, having deterministic (e.g., fixed) access times associated therewith, so that the controller can know when the execution of a command is complete and a new command can be issued. However, such a deterministic access timing scheme may not be compatible with memory devices that include cache memory, because the amount of time to execute a command (or group of commands) may vary (e.g., may not be fixed), depending on whether the command ends up being executed on the cache or the main memory.

DETAILED DESCRIPTION

Figure 1:
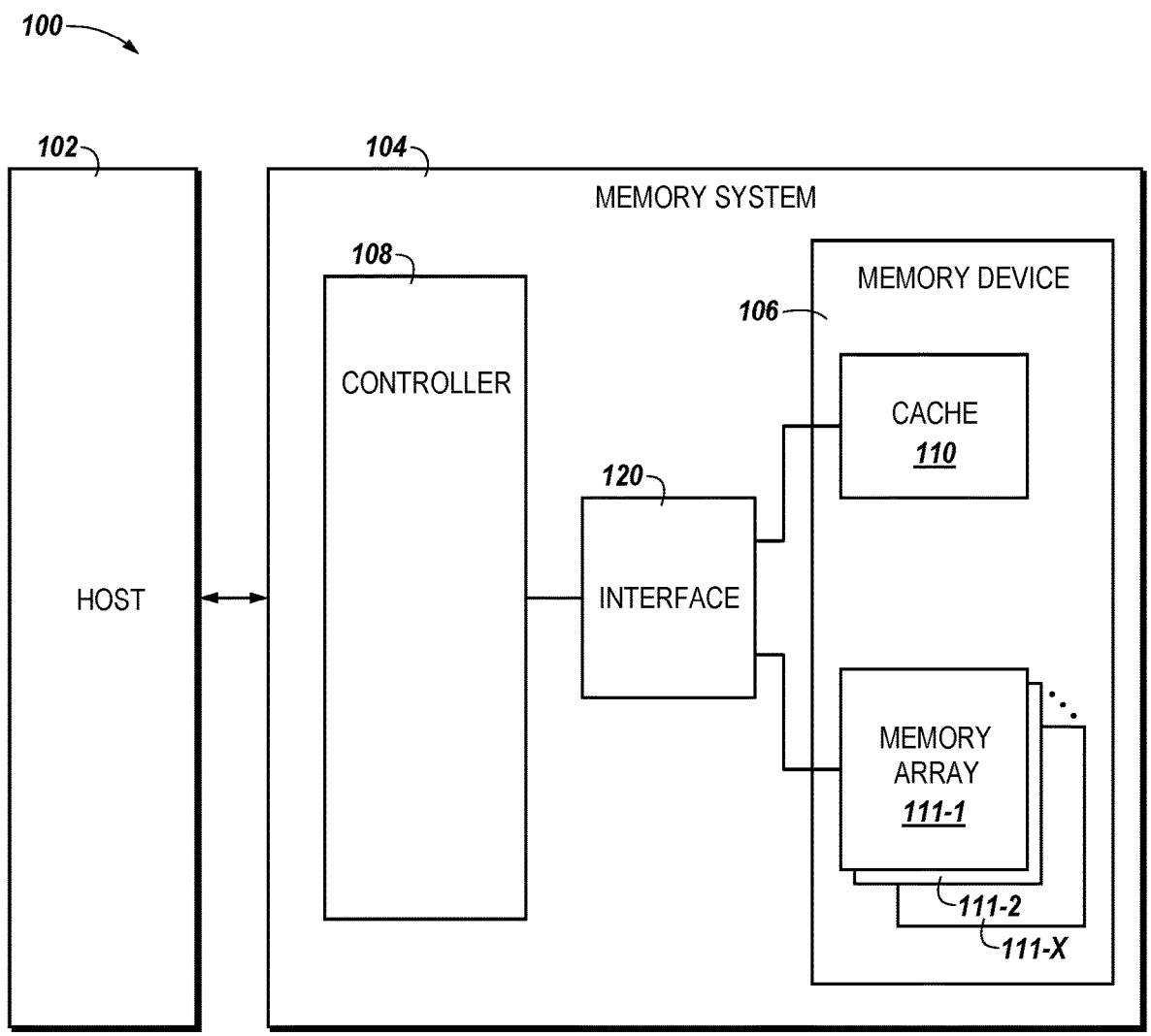
FIG. 1 illustrates a block diagram of a computing system in accordance with an embodiment of the present disclosure.

The present disclosure includes an interface for memory having a cache and multiple independent arrays. An embodiment includes a memory device having a cache and a plurality independent memory arrays, a controller, and an interface configured to communicate a plurality of commands from the controller to the memory device, wherein the interface includes a pin configured to activate upon a first one of the plurality of commands being received by the memory device and deactivate once all of the plurality of commands have been executed by the memory device.

Embodiments of the present disclosure can provide an interface between (e.g., a communication protocol capable of interfacing) a memory device having a cache and a multiple array (e.g. multiple bank) architecture, and a controller of the memory device, that allows the controller to issue commands (e.g., program and/or sense commands) having non-deterministic (e.g., non-fixed) access times associated therewith. As such, embodiments of the present disclosure can allow for non-deterministic access timing schemes to be utilized in operating a memory device having a cache and multiple bank architecture, thereby allowing for a memory device with a multiple bank architecture to also achieve the speed and/or performance benefits associated with having cache memory.

As used herein, "a" or "an" can refer to one or more of something, and "a plurality of" can refer to more than one of such things. For example, a memory device can refer to one or more memory devices, and a plurality of memory devices can refer to two or more memory devices. Additionally, the designator "X", as used herein, particularly with respect to reference numerals in the drawings, indicates that one or more of the particular feature so designated can be included with embodiments of the present disclosure.

The figures herein follow a numbering convention in which the first digit or digits correspond to the drawing figure number and the remaining digits identify an element or component in the drawing. Similar elements or components between different figures may be identified by the use of similar digits. For example, 120 may reference element "20" in FIG. 1, and a similar element may be referenced as 220 in FIG. 2.

FIG. 1 illustrates a block diagram of a computing system 100 in accordance with an embodiment of the present disclosure. As shown in FIG. 1, computing system 100 can include a host 102 and an apparatus in the form of a memory system 104. As used herein, an "apparatus" can refer to, but is not limited to, any of a variety of structures or combinations of structures, such as a circuit or circuitry, a die or dice, a module or modules, a device or devices, or a system or systems, for example. Further, although memory system 104 is shown as being external to host 102 in the example illustrated in FIG. 1, embodiments of the present disclosure are not so limited. For example, in a number of embodiments, memory system 104 may be internal to (e.g., included within) host 102.

Host 102 can include a memory, such as a random-access memory (RAM) (not shown in FIG. 1 so as not to obscure embodiments of the present disclosure), and a memory access device, such as a processor and/or controller, for communicating with memory system 104. One of ordinary skill in the art will appreciate that "a processor" can intend one or more processors, such as a parallel processing system, one or more coprocessors, etc. Example hosts can include laptop computers, personal computers, digital cameras, digital recording and playback devices, mobile devices (e.g., smart phones, tablets, etc.), PDAs, memory card readers, interface hubs, and the like.

Host 102 can send commands to memory system 104 via a channel. For instance, host 102 can communicate with memory system 104 to sense (e.g., read), program (e.g., write), and erase information (e.g., data), among other operations. A physical host interface (not shown in FIG. 1) can provide an interface for passing control, address, data, and other signals between memory system 104 and host 102 having compatible receptors for the physical host interface. The signals can be communicated between host 102 and memory system 104 on a number of buses, such as a data bus and/or an address bus, for example, via channels (not shown in FIG. 1).

As shown in FIG. 1, memory system 104 can include a memory device 106, a controller 108, and an interface 120. Controller 108 can communicate with memory device 106 to sense (e.g., read), program (e.g., write), and/or erase information, among other operations (e.g., in response to receiving commands from host 102). Controller 108 can include, for example, control circuitry and/or logic (e.g., hardware, firmware, and/or software). Controller 108 can be included on the same physical device (e.g., the same die) as memory device 106, or can be included on a separate physical device that is communicatively coupled to the physical device that includes memory device 106. In an embodiment, components of controller 108 can be spread across multiple physical devices (e.g., some components on the same die as memory device 106, and some components on a different die, module, or board).

As shown in FIG. 1, memory device 106 can include a cache 110, and a plurality of independent memory arrays (e.g., banks) 111-1, 111-2, . . . , 111-X in a multiple array (e.g., multiple bank) architecture. Cache 110 and/or arrays 111-1, 111-2, . . . , 111-X can include volatile memory such as, for instance, DRAM. However, embodiments of the present disclosure are not limited to a particular type of memory or memory device. For example, cache 110 and/or arrays 111-1, 111-2, . . . , 111-X can include other types of volatile and/or non-volatile memory, such as, for instance, SRAM, flash (e.g., NAND flash) memory, RRAM, or PCRAM, among other types of memory.

Memory arrays 111-1, 111-2, . . . , 111-X can include arrays of memory cells that provide main memory for memory system 104, or could be used as additional memory or storage throughout memory system 104. Cache 110 can be used to cache data that is used during execution of read commands and/or write commands. For example, cache 110 can include an array of memory cells (e.g., DRAM cells) that are used as cache and can be configured to store data that is also stored in memory arrays 111-1, 111-2, . . . , 111-X. The data stored in cache 110 and memory arrays 111-1, 111-2, . . . , 111-X can be addressed by controller 108, and can be located in cache 110 and/or arrays 111-1, 111-2, . . . , 111-X during execution of a command.

Interface 120 can communicate commands from controller 108 (e.g., commands received by controller 108 from host 102) to memory device 106 for execution. For instance, interface 120 can allow controller 108 to issue commands (e.g., program and/or sense commands) having non-deterministic (e.g., non-fixed) access times associated therewith. Examples of interface 120 will be further described herein.

The embodiment illustrated in FIG. 1 can include additional circuitry that is not illustrated so as not to obscure embodiments of the present disclosure. For example, memory device 106 can include address circuitry to latch address signals provided over I/O connectors through I/O circuitry. Address signals can be received and decoded by a row decoder and a column decoder, to access memory arrays 111-1, 111-2, . . . , 111-X.

Figure 2:
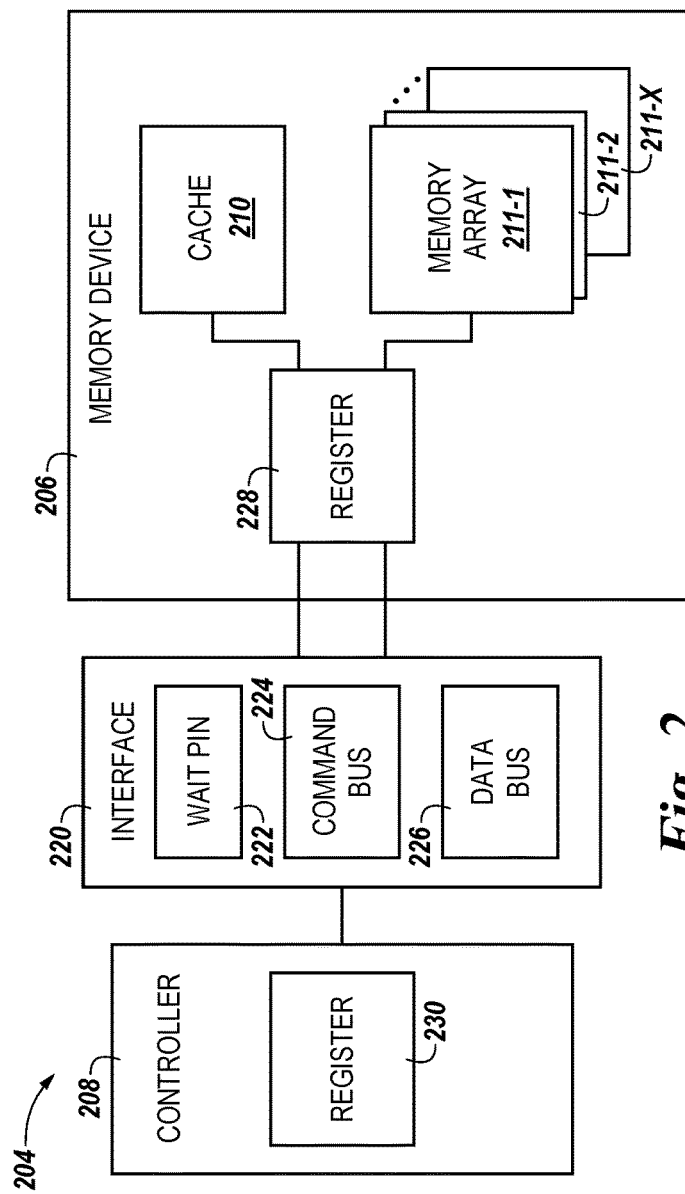
FIG. 2 illustrates a block diagram of a memory system in accordance with an embodiment of the present disclosure.

FIG. 2 illustrates a block diagram of a memory system 204 in accordance with an embodiment of the present disclosure. Memory system 204 can be an example of memory system 104 previously described in connection with FIG. 1. For instance, memory device 206, controller 208, cache 210, memory arrays 211-1, 211-2, . . . , 211-X, and interface 220 can be examples of memory device 106, controller 108, cache 110, memory arrays 111-1, 111-2, . . . , 111-X, and interface 120, respectively, previously described in connection with FIG. 1.

Interface 220 can communicate (e.g., via command bus 224) a plurality of commands from controller 208 to memory device 206 for execution. For instance, the commands may be issued by controller 208 in groups, which may be referred to herein as bunches. In the example illustrated in FIG. 2, a group (e.g., bunch) of commands can include program (e.g., write) commands and/or sense (e.g., read) commands. For instance, a group of commands may include at least one read command and at least one write command. However, a group of commands may include no more than a single command associated with any one of memory arrays 211-1, 211-2, . . . , 211-X (e.g., the bunch may include at most one read command or write command per bank).

Each of the plurality of commands issued by controller 208 can have a non-deterministic (e.g., non-fixed) access timing associated therewith (e.g., the amount of time needed to execute the command may depend on whether it is executed on cache 210 or one of arrays 211-1, 211-2, . . . , 211-X). The quantity (e.g., number) of commands in a group may correspond to a maximum time latency associated with memory device 206. The maximum time latency can be, for instance, the amount of time needed by memory device 206, beginning with the first command of the group, to enable the input and/or output paths of its data buffers without saturating the capabilities of memory arrays 211-1, 211-2, . . . , 211-X (e.g., without saturating the number of available banks). Additional commands outside of this time slot can be queued in controller 208.

In the example illustrated in FIG. 2, interface 220 includes a pin 222, which may be referred to herein as a wait pin, a command bus 224, and a data bus 226. Wait pin 222 may activate upon the first command in a group being received by memory device 206, and may deactivate once all of the commands in the group have been executed by the memory device. For instance, the signal output by wait pin 222 may be activated (e.g., asserted) upon memory device 206 receiving the first command of the group, and deactivated (e.g., de-asserted) once all the commands of the group have been executed.

Upon wait pin 222 (e.g., upon the signal output by wait pin 222) being deactivated, data associated with the read commands (e.g., data read during execution of the read commands) of the group may be output to controller 208 by data bus 226 of interface 220. The order in which the read data is output to controller 208 can correspond to the order in which the read commands of the group were issued to memory device 206 from controller 208 (e.g., the data read during the execution of the read commands can be output in the order in which the read commands were issued). For instance, as shown in FIG. 2, memory device 206 and controller 208 can each include a register 228 and 230, respectively, that can store the order in which the commands of the group are issued to the memory device from the controller. Memory device 206 can use register 228 (e.g., the command order stored in register 228) to output the read data in the same order as their respective read commands were issued by controller 208, and controller 208 can use register 230 (e.g., the command order stored in register 230) to know the order of the read data arriving from the memory device.

While the read data is being output to controller 208 by data bus 226 of interface 220, an additional (e.g. new) group of commands issued by controller 208 can be communicated to memory device 206 by command bus 224 of interface 220. This command overlap can be accomplished by saving the content of registers 228 and 230 in memory device 206 and controller 208 respectively. For instance, memory device 206 can duplicate the content of register 228 upon wait pin 222 being deactivated, and controller 208 can duplicated the content of register 230 before starting the sequence of the new command group.

Figure 3:
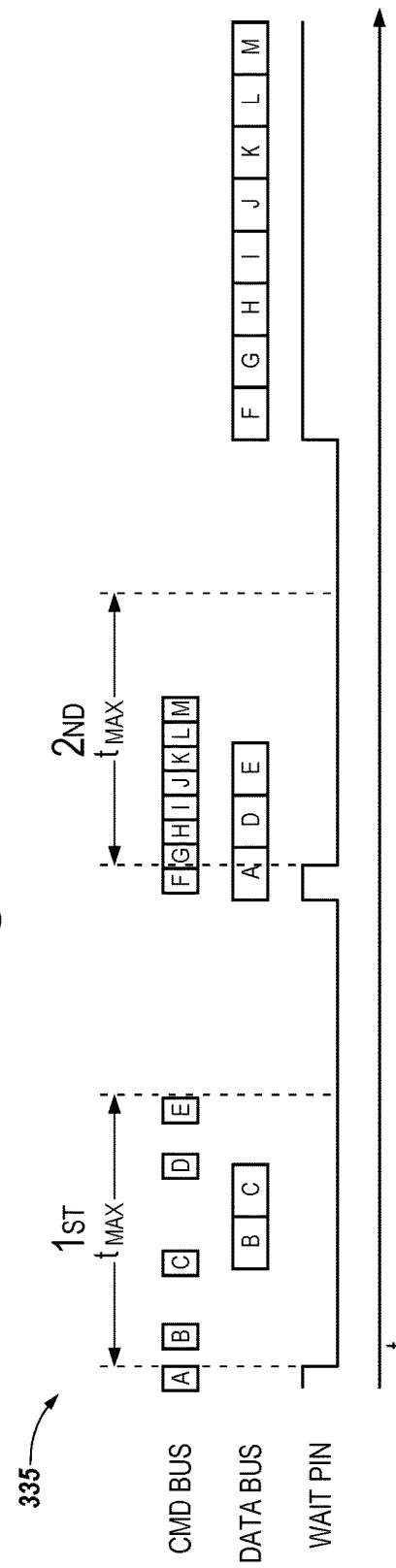
FIG. 3 is a timing diagram illustrating a conceptual example of the operation of the interface of the memory system of FIG. 2 in accordance with an embodiment of the present disclosure.

FIG. 3 is a timing diagram 335 illustrating a conceptual example of the operation of interface 220 previously described in connection with FIG. 2 in accordance with an embodiment of the present disclosure. For instance, the wait pin, command bus, and data bus referred to in FIG. 3 can correspond to wait pin 222, command bus 224, and data bus 226, respectively, previously described in connection with FIG. 2.

In the example illustrated in FIG. 3, the command bus of interface 220 is communicating a first group of commands (e.g., comprising commands A, B, C, D, and E) and a second group of commands (e.g., comprising commands F, G, H, I, J, K, L, and M) from controller 208 to memory device 206. In the example illustrated in FIG. 3, commands A, D, E, F, G, H, I, J, K, L, and M may be read commands, and commands B and C may be write commands. Further, as shown in FIG. 3, the number of commands in the first group corresponds to (e.g., is limited by) the maximum time latency ($t_{MAX}$) associated with memory device 206 such that the bank capability is saturated, while the number of commands in the second group saturates the number of available banks.

As shown in FIG. 3, the wait pin is activated upon the first command of the first group (e.g., command A) being received by the memory device. Once all commands of the first group have been executed, the wait pin is deactivated, and the data read during execution of read commands A, D, and E, respectively, is output to the controller by the data bus in their order of execution, as illustrated in FIG. 3.

As shown in FIG. 3, while the data read during execution of read commands A, D, and E is being output by the data bus, the command bus begins to communicate the second group of commands to the memory device, and the wait pin is once again activated upon the first command of the second group (e.g., command F) being received by the memory device. Once all the commands of the second group have been executed, the wait pin is deactivated, and the data read during execution of read commands F, G, H, I, J, K, L, and M, respectively, is output to the controller by the data bus in their order of execution, as illustrated in FIG. 3.

Figure 4:
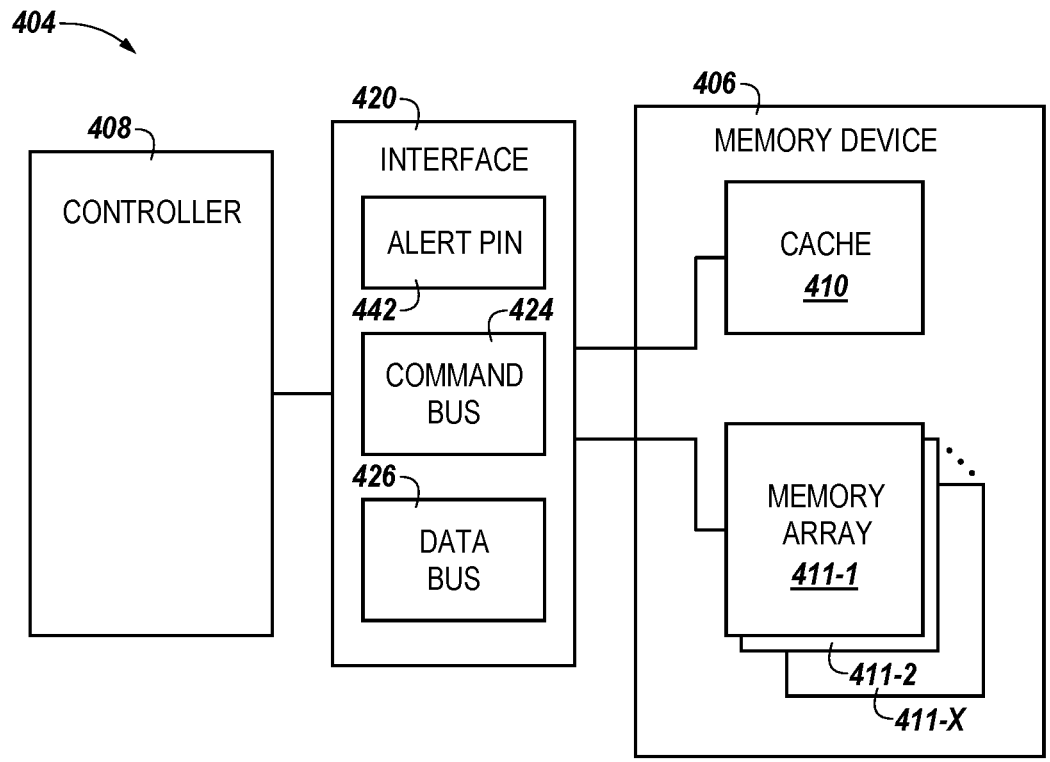
FIG. 4 illustrates a block diagram of a memory system in accordance with an embodiment of the present disclosure.

FIG. 4 illustrates a block diagram of a memory system 404 in accordance with an embodiment of the present disclosure. Memory system 404 can be an example of memory system 104 previously described in connection with FIG. 1. For instance, memory device 406, controller 408, cache 410, memory arrays 411-1, 411-2, . . . , 411-X, and interface 420 can be examples of memory device 106, controller 108, cache 110, memory arrays 111-1, 111-2, . . . , 111-X, and interface 120, respectively, previously described in connection with FIG. 1.

Interface 420 can communicate (e.g., via command bus 424) a plurality of commands from controller 408 to memory device 406 for execution. For instance, the commands may be issued by controller 408 in groups (e.g., bunches). In the example illustrated in FIG. 4, a group (e.g., bunch) of commands can include only sense (e.g., read) commands (e.g., the bunch may not include any write commands). Further, each of the plurality of commands issued by controller 408 can have a non-deterministic (e.g., non-fixed) access timing associated therewith (e.g., the amount of time needed to execute the command may depend on whether it is executed on cache 410 or one of arrays 411-1, 411-2, . . . , 411-X).

In the example illustrated in FIG. 4, interface 420 includes a pin 442, which may be referred to herein as an alert pin, a command bus 424, and a data bus 426. Alert pin 442 may activate upon one of the read commands in a group being executed on one of arrays (e.g. banks) 411-1, 411-2, . . . , 411-X, and may deactivate upon one of the read commands in the group being executed on cache 410. For instance, the signal output by alert pin 442 may be activated (e.g., asserted) upon a read command of the group being executed on one of arrays 411-1, 411-2, . . . , 411-X, and deactivated (e.g., de-asserted) upon a read command of the group being executed on cache 410. The execution of a command on one of arrays 411-1, 411-2, . . . , 411-X may be referred to herein as a "miss", and the execution of a command on cache 410 may be referred herein as a "hit". As such, alert pin 442 may provide information associated with (e.g., an indication of) the execution status of the command to controller 408.

Data associated with the read commands (e.g., data read during execution of the read commands) of the group may be output to controller 408 by data bus 426 of interface 420. The signal output by alert pin 442 may be asynchronous (e.g., out of phase) with the signal output by data bus 426, and controller 408 can use the signal output by alert pin 442 to determine the validity of the data being output by data bus 426. For example, controller 408 can determine whether the data output by data bus 426 is valid based on whether the signal output by alert pin 442 is activated or deactivated. The data may be invalid if the signal is activated (e.g., signifying a miss), and the data may be valid if the signal is deactivated (e.g., signifying a hit).

Upon a read command of a group being executed on one of arrays 411-1, 411-2, 411-X (e.g., in the case of a miss, in which case data bus 426 would otherwise output invalid and useless data to controller 408), data bus 426 can provide information (e.g., hints) associated with an expected latency of the execution of the read command to controller 408. The expected latency of the execution of the command can refer to how long it is expected to take for the command to be executed, and/or when the array (e.g. bank) upon which the command is being executed will be available to receive a new command for execution. The information associated the expected latency of the execution of the command can include, for example, information indicating the minimum number of clock cycles for controller 408 to wait before issuing a new command to be executed at the same location (e.g., address) of the array as the command currently being executed. This information can be determined (e.g., calculated) by memory device 406 while the command is being executed.

Controller 408 reschedule occupation of data bus 426 for obtaining the data associated with (e.g., to be read by) the read command based on the information associated with the expected latency of the execution of the command. For instance, controller can use the information associated with the expected latency of the execution of the read command to reschedule a time slot on data bus 426 for obtaining the requested data to a time slot when the data will be available to be output from memory device 406 to controller 408.

Figure 5:
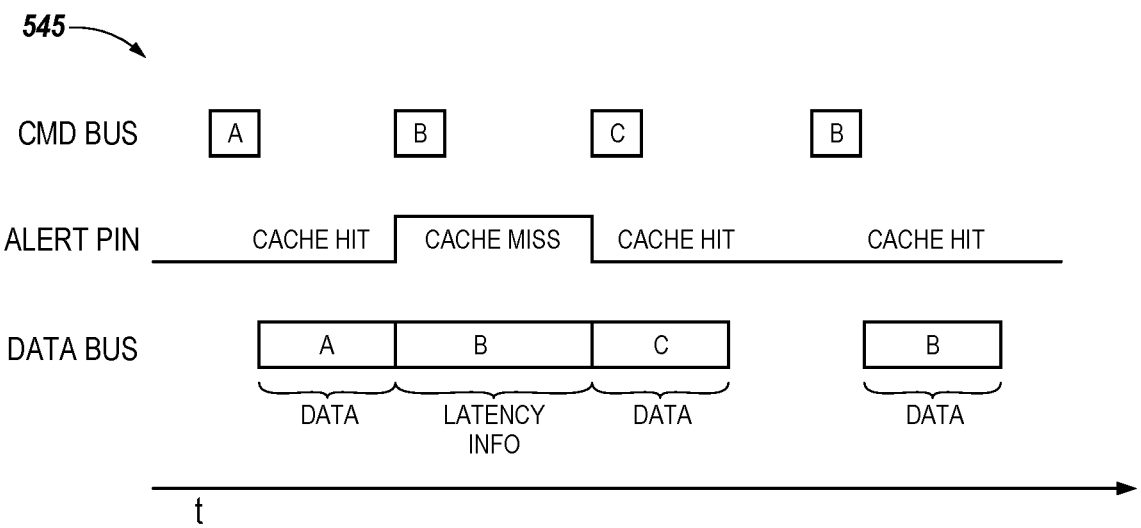
FIG. 5 is a timing diagram illustrating a conceptual example of the operation of the interface of the memory system of FIG. 4 in accordance with an embodiment of the present disclosure.

FIG. 5 is a timing diagram 545 illustrating a conceptual example of the operation of interface 420 previously described in connection with FIG. 4 in accordance with an embodiment of the present disclosure. For instance, the alert pin, command bus, and data bus referred to in FIG. 5 can correspond to alert pin 442, command bus 424, and data bus 426, respectively, previously described in connection with FIG. 4.

In the example illustrated in FIG. 5, the command bus of interface 420 is communicating a group of read commands (e.g., comprising read commands A, B, and C) from controller 408 to memory device 406. In the example illustrated in FIG. 5, command A is executed on cache 410 (e.g., command A results in a hit). Accordingly, the alert pin is (e.g., remains) deactivated upon the execution of command A, and the data read during the execution of command A is output to controller 408 by the data bus, as shown in FIG. 5.

Continuing in the example, command B is then executed on one of arrays (e.g. banks) 411-1, 411-2, . . . , 411-X (e.g., command B results in a miss). Accordingly, the alert pin is activated upon the execution of command B, and information (e.g., hints) associated with the expected latency of the execution of command B is output to controller 408 by the data bus, as shown in FIG. 5, for controller 408 to use in rescheduling the execution of command B.

Continuing in the example, command C is then executed on cache 410 (e.g., command C results in a hit). Accordingly, the alert pin is deactivated upon the execution of command C, and the data read during the execution of command C is output to controller 408 by the data bus, as shown in FIG. 5.

Continuing in the example, command B is once again executed (e.g., according to its rescheduling); it is now executed on cache 410. Accordingly, the alert pin is (e.g., remains) deactivated upon the re-execution of command B, and the data read during the execution of command B is now output to controller 408 by the data bus, as shown in FIG. 5.

Figure 6:
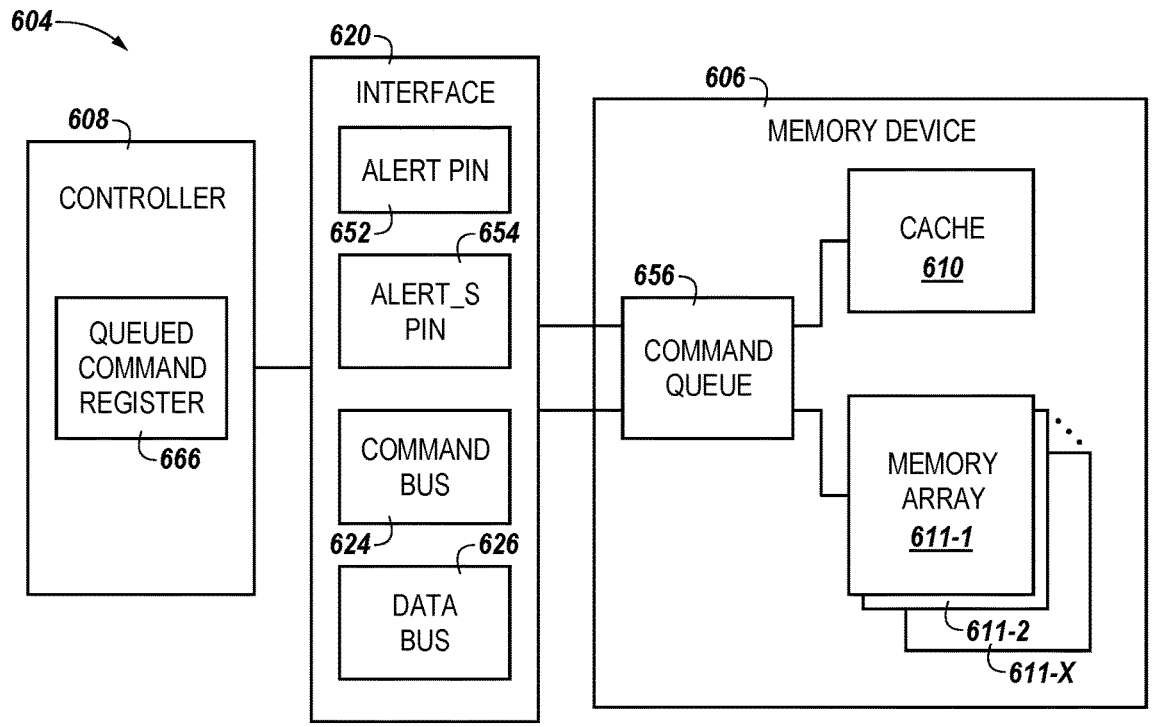
FIG. 6 illustrates a block diagram of a memory system in accordance with an embodiment of the present disclosure.

FIG. 6 illustrates a block diagram of a memory system 604 in accordance with an embodiment of the present disclosure. Memory system 604 can be an example of memory system 104 previously described in connection with FIG. 1. For instance, memory device 606, controller 608, cache 610, memory arrays 611-1, 611-2, . . . , 611-X, and interface 620 can be examples of memory device 106, controller 108, cache 110, memory arrays 111-1, 111-2, . . . , 111-X, and interface 120, respectively, previously described in connection with FIG. 1.

Interface 620 can communicate (e.g., via command bus 624) a plurality of commands from controller 608 to memory device 606 for execution. For instance, the commands may be issued by controller 608 in groups (e.g., bunches). In the example illustrated in FIG. 6, a group (e.g., bunch) of commands can include sense (e.g., read) commands and/or program (e.g., write) commands. For instance, a group of commands may include at least one read command and at least one write command. Further, each of the plurality of commands issued by controller 608 can have a non-deterministic (e.g., non-fixed) access timing associated therewith (e.g., the amount of time needed to execute the command may depend on whether it is executed on cache 610 or one of arrays 611-1, 611-2, . . . , 611-X).

In the example illustrated in FIG. 6, interface 620 includes a first pin 652, which may be referred to herein as an alert pin, a second pin 654, which may be referred to herein as an alert_S pin, a command bus 624, and a data bus 626. Although the alert_S pin is illustrated as a single pin (e.g., 654) in FIG. 6, in some embodiments the alert_S pin may comprise two pins.

Alert pin 652 may activate upon one of the commands in a group being executed on one of arrays (e.g. banks) 611-1, 611-2, . . . , 611-X (e.g., upon a miss), and may deactivate upon one of the commands in the group being executed on cache 610 (e.g., upon a hit). For instance, the signal output by alert pin 652 may be activated (e.g., asserted) upon a command of the group being executed on one of arrays 611-1, 611-2, . . . , 611-X (e.g., upon a miss), and deactivated (e.g., de-asserted) upon a command of the group being executed on cache 610 (e.g., upon a hit).

Data associated with the write commands (e.g., the data to be written during execution of the write commands) of the group may be input to memory device 606 by data bus 626 of interface 620, and data associated with the read commands (e.g., data read during execution of the read commands) of the group may be output to controller 608 by data bus 626. The signal output by alert pin 652 may be synchronous (e.g., in phase) with the signal output by data bus 626. Controller 608 can use the signal output by alert pin 652 to determine the validity of the read data being output by data bus 626 (e.g., in a manner analogous to that previously described for controller 408 in connection with FIG. 4) in the case of a read command or the completion of the write operation for the data being input by the data bus in the case of a write command.

Upon a read or write command of the group being executed on one of arrays 611-1, 611-2, 611-X (e.g., in the case of a miss), alert pin 652 (e.g., the signal output by alert pin 652) can provide information (e.g., hints) associated with an expected latency of the execution of the command to controller 608. The expected latency of the execution of the command, and the information associated the expected latency of the execution of the command, can be analogous to the expected latency, and the information associated therewith, previously described in connection with FIG. 4.

Controller 608 reschedule occupation of data bus 626 for obtaining the data to be read by the read command or writing the data to be written by the next write command based on the information associated with the expected latency of the execution of the command. For instance, controller can use the information associated with the expected latency of the execution of the command to reschedule a time slot on data bus 626 for obtaining or writing the requested data to a time slot when the data will be available to be output from or accepted to be written by memory device 606.

Alert_S pin 654 can strobe information associated with the signal output by alert pin 652 while alert pin 652 is activated (e.g., as a result of a miss for either a read or write command). For instance, alert_S pin 654 can synchronize and/or align the data values conveyed by alert pin 652 at each respective clock beat, such that controller 608 can process the data output from memory device 606.

In some embodiments, memory device 606 can include a command queue (e.g., command queue 656 illustrated in FIG. 6). Command queue 656 can store the commands of a group that have been received by memory device 606, but have not yet been executed, in the order in which they are to be executed. In such an embodiment, alert pin 652 (e.g., the signal output by alert pin 652) can provide to controller 608, in addition to the information indicating whether an executed command resulted in a miss or a hit and the information associated with the expected latency of a command that resulted in a miss, information associated with (e.g. indicating) the quantity of free (e.g., available) entries in command queue 656, and information associated with (e.g., indicating) an identification (e.g., ID) assigned to that executed command when it was added to (e.g., inserted in) command queue 656. In such an embodiment, controller 608 can include a queued command register (e.g., queued command register 666 illustrated in FIG. 6) where all read requests that generate a miss can be tagged with the associated identification (e.g., ID) received by memory device 606 through alert pin 652 (e.g., the signal output by alert pin 652).

The information associated with the quantity of free entries in command queue 656, and/or the next ready cycle of the command queue, can be provided by alert pin 652 responsive to an additional fixed-timing command received from controller 608. This command may be referred to herein as a "CQ status" command. In some embodiments, the information associated with the expected latency of a command that resulted in a miss can also be provided responsive to the CQ status command.

The identification assigned to a command when it is added to command queue 656 can be used by controller 608 to determine whether data being output by data bus 626 is valid, and can include, for example, a unique ID assigned by memory device 606 when the command is added to command queue 656, which may be referred to herein as "assigned ID curr". By comparing an executed command's "assigned ID curr" field versus all zero, controller 608 can determine whether the executed command resulted in a miss or a hit and, if the command is a read command that resulted in a miss (e.g., "assigned ID curr" is not equal to all zero), tag the corresponding read request with the received "assigned ID curr" in queued command register 666 for data to be output later by memory device 606. Further, in the case of a read command that resulted in a miss, the "assigned ID curr" that was previously assigned to the command when it was added to command queue 656, which may be referred to herein as "assigned ID prev", may also be provided to controller 608. When this "assigned ID prev" filed is provided, this can indicate to controller 608 that data being output by data bus 625 is valid, but is not associated with the command that resulted in the miss. Rather, this data is associated with a previous read command whose execution also resulted in a miss and had the "assigned ID prev" value associated therewith. In such an instance, controller 608 can use this field to look up this command in queued command register 666, and delete it once its associated data has been received. As an example, the "assigned ID curr" and "assigned ID prev" fields can each comprise six-bit fields in the signal output by alert pin 652.

Memory device 606 may execute the commands of a group out of the order in which they are stored in command queue 656 upon alert pin 652 being activated (e.g., upon one of the commands of the group resulting in a miss). For example, controller 608 may issue an additional fixed-timing command to memory device 606 to output data associated with a previously executed read command of the group that also resulted in a miss upon alert pin 652 (e.g., the signal output by alert pin 652) being activated. This command, which may be referred to herein as an "out of order burst read (OoOBR)" command, may result in memory device 606 outputting the data (through data bus 626) and the "assigned ID prev" (through alert pin 652) of the previously executed read command that has been queued into command queue 656.

The information associated with the expected latency of a command that resulted in a miss that is provided by alert pin 652 can include information indicating the type of the command, and information indicating when the execution of the queued command will be complete. For example, the signal output by alert pin 652 can include information indicating whether the command is a read command or write command, and, if the command is a read command, information indicating the length of the read command, when the data associated with (e.g., read during execution of) the read command will be available to be output from memory device 606, and when the output of the read data will start.

As an example, the information indicating the type of the command can comprise a one-bit field indicating whether the command is a read or write command. Further, the information indicating when the execution of the command will be complete can comprise a four-bit field indicating when the execution of the command will be complete and, if the command is a read command, when the output of the read data could start. Further, the information indicating the length of the read command can comprise a one-bit field indicating the length of the OoOBR command needed to output the read data, and the information indicating when the read data will be available to be output can comprise a two-bit filed used as a multiplying factor to obtain the scaled time after which the read data will be available to be output.

In an example sequence of read commands (e.g., burst read commands), a signal output by alert pin 652 having an all zero "assigned ID curr" field can indicate that a hit has occurred on the first output timeframe, thereby indicating the data values output by data bus 626 are valid, while the remaining bits of the signal can be the latency information indicating when the execution of a queued command will be complete and its associated data (if any) would be available to be output from memory device 606 by data bus 626. In contrast, the signal output by alert pin 652 may indicate a miss by outputting a non-zero "assigned ID curr" field, which can be used by controller 608 to tag the command in queued command register 666 until later, when its associated data will be received by controller 608.

Further, the miss may make the output timeframe of data bus 626 related to the command useless, since there would be no valid data to be output. In such a case, if memory device 606 has completed the execution of another read command that was previously queued in command queue 656, this output timeframe can instead be used to output on data bus 626 data associated with that previous command, and its ID can be tagged in the "assigned ID prev" filed output by alert pin 652 to indicate to controller 608 which command the data being output by data bus 626 is associated with. Memory controller 608 can then use this information to look up and delete the corresponding command entry from queued command register 666.

If memory device 606 has no data to output on data bus 626 during an output timeframe, the signal output by alert pin 652 can comprise a non-zero "assigned ID curr" field, and a field indicating when (e.g., the time) the execution of the queued command will be complete. Controller 608 can use this time to schedule when an OoOBR command could be issued to obtain the read data from data bus 626 and the associated "assigned ID prev" from the signal output by alert pin 652. Memory controller 608 can also use this information to look up and delete the corresponding command entry from queued command register 666.

Before issuing a group of read or write commands, controller 608 can determine the quantity of free (e.g., available) entries (e.g., positions) in command queue 656 using the signal output by alert pin 652. Controller 608 may then issue a group of commands that includes a number of commands that is less than or equal to the quantity of free entries. During the execution of the commands of the group, controller 608 can monitor the information output by alert pin 652 to determine whether there are free entries in command queue 656 (e.g., whether command queue 656 is full), and hence whether additional commands could be issued. For instance, the quantity of free entries in command queue 656 may be decremented (e.g., decreased) upon a command resulting in a miss and the signal output by alert pin 652 not including information indicating the data being output by data bus 626 is valid, and the quantity of free entries in the queue may be incremented (e.g., increased) upon the data associated with the previous read command that resulted in a miss being output by data bus 626 using the OoOBR command. If, after the increment or decrement, there are free entries in command queue 656, controller 608 can issue additional commands.

For a group of write commands, no information may be returned to controller 608 when the execution of each respective command is complete. Accordingly, controller 608 may use the information output by alert pin 652 indicating whether the command resulted in a hit or miss only to decrease the quantity of free entries in command queue 656. When command queue 656 is not full, the information included in the signal output by alert pin 652 indicating the quantity of free entries can be monitored by controller 608 to determine how many additional write commands could be issued to memory device 606, since each of them could potentially result in a miss and, therefore, need a free position in command queue 656.

When command queue 656 is full, controller 608 can use the information (e.g. field) included in the signal output by alert pin 652 indicating when the execution of a queued command is complete to determine when a position in the queue will become available (e.g., upon the completion of the execution of the queued command) or could become available (e.g., upon completion of an OoOBR command to recover the related data), and accordingly to determine when an additional command could be issued. Further, controller 608 may also issue a CQ status command to obtain the updated quantity of free entries in command queue 656, and use this information to determine whether, and how many, additional commands could be issued.

Figure 7:
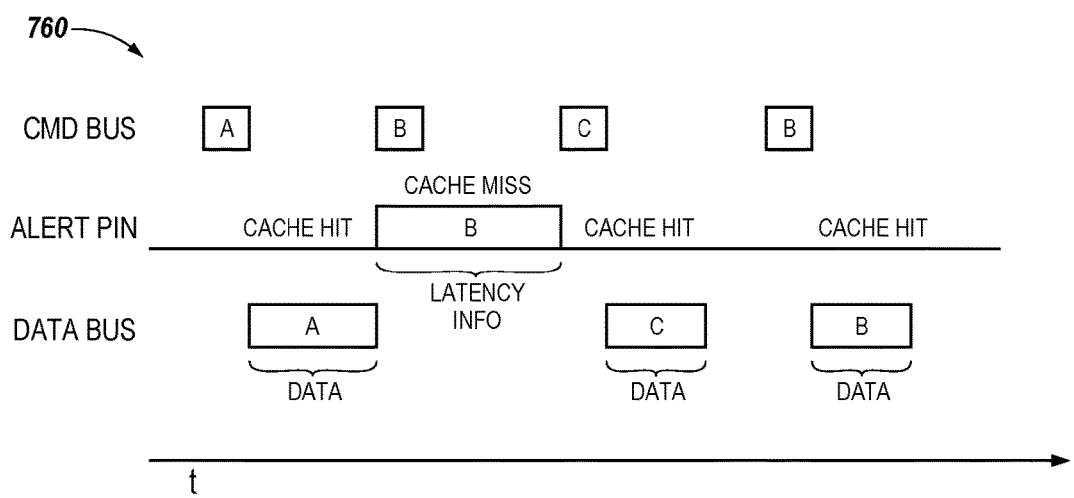
FIG. 7 is a timing diagram illustrating a conceptual example of the operation of the interface of the memory system of FIG. 6 in accordance with an embodiment of the present disclosure.

FIG. 7 is a timing diagram 760 illustrating a conceptual example of the operation of interface 620 previously described in connection with FIG. 6 in accordance with an embodiment of the present disclosure. For instance, the alert pin, command bus, and data bus referred to in FIG. 7 can correspond to alert pin 652, command bus 624, and data bus 626, respectively, previously described in connection with FIG. 6.

In the example illustrated in FIG. 7, the command bus of interface 620 is communicating a group of read commands (e.g., comprising read commands A, B, and C) from controller 608 to memory device 606. In the example illustrated in FIG. 7, command A is executed on cache 610 (e.g., command A results in a hit). Accordingly, the alert pin is (e.g., remains) deactivated upon the execution of command A, and the data read during the execution of command A is output to controller 608 by the data bus, as shown in FIG. 7.

Continuing in the example, command B is then executed on one of arrays (e.g. banks) 611-1, 611-2, . . . , 611-X (e.g., command B results in a miss). Accordingly, the alert pin is activated upon the execution of command B, and information (e.g., hints) associated with the expected latency of the execution of command B is provided to controller 608 by the alert pin (e.g., by the signal output by the alert pin), as shown in FIG. 7, for controller 608 to use in rescheduling the execution of command B.

Continuing in the example, command C is then executed on cache 610 (e.g., command C results in a hit). Accordingly, the alert pin is deactivated upon the execution of command C, and the data read during the execution of command C is output to controller 608 by the data bus, as shown in FIG. 7.

Continuing in the example, command B is once again executed (e.g., according to its rescheduling); it is now executed on cache 610. Accordingly, the alert pin is (e.g., remains) deactivated upon the re-execution of command B, and the data read during the execution of command B is now output to controller 608 by the data bus, as shown in FIG. 7.

Figure 8:
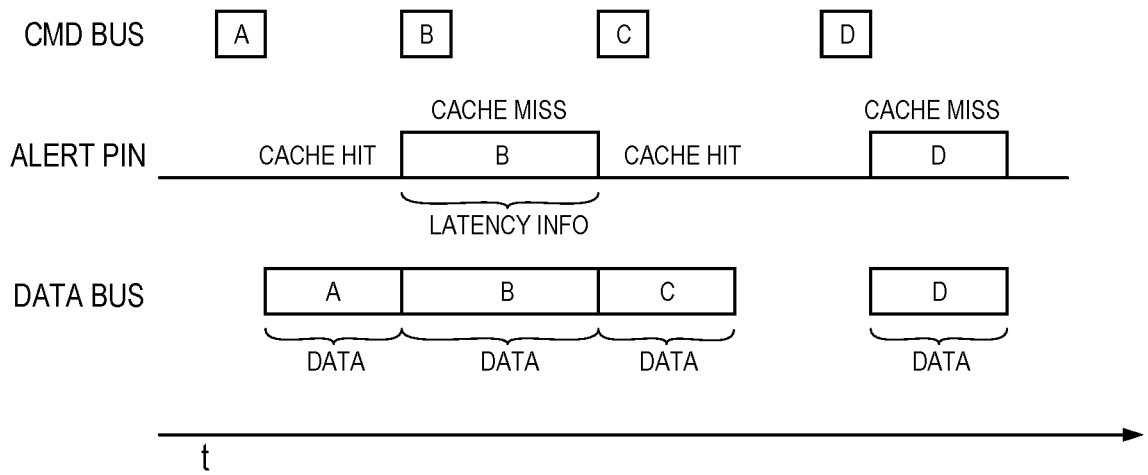
FIG. 8 is a timing diagram illustrating an additional conceptual example of the operation of the interface of the memory system of FIG. 6 in accordance with an embodiment of the present disclosure.

FIG. 8 is a timing diagram 865 illustrating an additional conceptual example of the operation of interface 620 previously described in connection with FIG. 6 in accordance with an embodiment of the present disclosure. For instance, the alert pin, command bus, and data bus referred to in FIG. 8 can correspond to alert pin 652, command bus 624, and data bus 626, respectively, previously described in connection with FIG. 6.

In the example illustrated in FIG. 8, the command bus of interface 620 is communicating a group of write commands (e.g., comprising write commands A, B, C, and D) from controller 608 to memory device 606. In the example illustrated in FIG. 8, command A is executed on cache 610 (e.g., command A results in a hit). Accordingly, the alert pin is (e.g., remains) deactivated upon the execution of command A, and the data to be written during the execution of command A is input to memory device 606 by the data bus, as shown in FIG. 8.

Continuing in the example, command B is then executed on one of arrays (e.g. banks) 611-1, 611-2, . . . , 611-X (e.g., command B results in a miss). Accordingly, the alert pin is activated upon the execution of command B, and information (e.g., hints) associated with the expected latency of the execution of command B is provided to controller 608 by the alert pin (e.g., by the signal output by the alert pin), as shown in FIG. 8. Controller 608 can use this information to schedule the next command (e.g., command D) that is to be executed on the bank on which command B is being executed. Additionally, the data to be written during the execution of command B is input to memory device 606 by the data bus, as shown in FIG. 8.

Continuing in the example, command C is then executed on cache 610 (e.g., command C results in a hit). Accordingly, the alert pin is deactivated upon the execution of command C, and the data to be written during the execution of command C is input to memory device 606 by the data bus, as shown in FIG. 8.

Continuing in the example, command D is then executed on the same bank 611-1, 611-2, ..., 611-X command B was executed (e.g. command D results in a miss). Accordingly, the alert pin is activated upon the execution of command D, and the data to be written during the execution of command D is input to memory device 606 by the data bus, as shown in FIG. 8.

Figure 9:
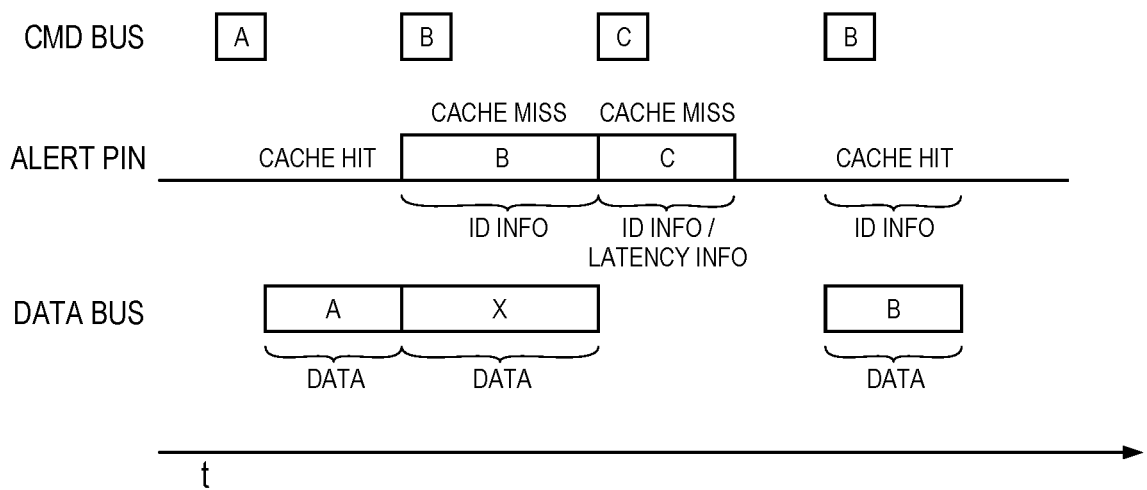
FIG. 9 is a timing diagram illustrating an additional conceptual example of the operation of the interface of the memory system of FIG. 6 in accordance with an embodiment of the present disclosure.

FIG. 9 is a timing diagram 970 illustrating an additional conceptual example of the operation of interface 620 previously described in connection with FIG. 6 in accordance with an embodiment of the present disclosure. For instance, the alert pin, command bus, and data bus referred to in FIG. 9 can correspond to alert pin 652, command bus 624, and data bus 626, respectively, previously described in connection with FIG. 6. Further, the example illustrated in FIG. 9 may apply to an embodiment in which memory device 606 includes a command queue (e.g., command queue 656 previously described in connection with FIG. 6).

In the example illustrated in FIG. 9, the command bus of interface 620 is communicating a group of read commands (e.g., comprising read commands A, B, and C) from controller 608 to memory device 606. In the example illustrated in FIG. 9, command A is executed on cache 610 (e.g., command A results in a hit). Accordingly, the alert pin is (e.g., remains) deactivated upon the execution of command A, and the data read during the execution of command A is output to memory device 606 by the data bus, as shown in FIG. 9.

Continuing in the example, command B is executed on one of arrays (e.g. banks) 611-1, 611-2, ..., 611-X (e.g., command B results in a miss). Accordingly, the alert pin is activated upon the execution of command B, and information associated with the identification (e.g., assigned ID curr) assigned to command B when it is added to command queue 656 is provided to controller 608 by the alert pin (e.g., by the signal output by the alert pin), as shown in FIG. 9, for controller 608 to use in completing the execution of command B out of order. Further, information associated with the identification (e.g., assigned ID prev) previously assigned to a previously issued read command (e.g., command X) that resulted in a miss is also provided to controller 608 by the alert pin, and the data that was read during the execution of command X is output to controller 608 by the data bus, as shown in FIG. 9.

Continuing in the example, command C is executed on one of arrays (e.g. banks) 611-1, 611-2, ..., 611-X (e.g., command C results in a miss). Accordingly, the alert pin is (e.g. remains) activated upon the execution of command C, and information associated with the identification (e.g., ID) assigned to command C when it was added to command queue 656 is provided to controller 608 by the alert pin (e.g., by the signal output by the alert pin), as shown in FIG. 9, for controller 608 to use in completing the execution of command C out of order. Further, information associated with the expected latency of the execution of the previous read command B is provided to controller 608 by the alert pin (e.g., by the signal output by the alert pin), as shown in FIG. 9, for controller 608 to use in rescheduling the execution of command B as an out of order burst read (OoOBR) command. Meanwhile, no data is output to controller 608 by the data bus, as shown in FIG. 9.

Continuing in the example, an OoOBR command is then issued for command B, which results in a cache hit, as illustrated in FIG. 9. Accordingly, the alert pin is deactivated, the information associated with the identification that was assigned to command B (e.g., which is now assigned ID prev) when it was added to command queue 656 is output by the alert pin, and the data read during the execution of command B is now output to controller 608 by the data bus, as shown in FIG. 9.

Although specific embodiments have been illustrated and described herein, those of ordinary skill in the art will appreciate that an arrangement calculated to achieve the same results can be substituted for the specific embodiments shown. This disclosure is intended to cover adaptations or variations of embodiments of the present disclosure. It is to be understood that the above description has been made in an illustrative fashion, and not a restrictive one. Combination of the above embodiments, and other embodiments not specifically described herein will be apparent to those of ordinary skill in the art upon reviewing the above description. The scope of embodiments of the present disclosure includes other applications in which the above structures and methods are used. Therefore, the scope of embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A memory system, comprising:
   a memory device having a cache and a plurality of independent memory arrays;
   a controller; and
   an interface configured to communicate a plurality of commands from the controller to the memory device, wherein the plurality of commands is a group of combined commands with each command of the group being associated with a respective one of the plurality of independent memory arrays, and wherein the interface includes a pin configured to:
   output a signal;
   activate, by the signal transitioning from a first level to a second level, upon a command of the plurality of commands being executed on only one of the plurality of independent memory arrays; and
   deactivate, by the signal transitioning from the second level to the first level, upon a command of the plurality of commands being executed only on the cache.

2. The memory system of claim 1, wherein the pin is configured to maintain the signal at the second level while the command is executed on the one of the plurality of independent memory arrays.

3. The memory system of claim 1, wherein the plurality of commands include at least one sense command.

4. The memory system of claim 1, wherein each respective one of the plurality of commands have a non-deterministic access timing associated therewith.

5. The memory system of claim 1, wherein the interface is configured to, upon the execution of the command on the one of the plurality of independent memory arrays, provide information associated with an expected latency of the execution of that command to the controller.

6. The memory system of claim 5, wherein the information associated with the expected latency of the execution of that command includes an amount of time needed to execute that command.

7. The memory system of claim 5, wherein the information associated with the expected latency of the execution of that command includes an indication of when the one of the plurality of independent memory arrays on which that command is being executed will be available to receive another one of the plurality of commands for execution.

8. A method of operating memory, comprising:
communicating, by an interface, a plurality of commands from a controller to a memory device having a cache and a plurality of independent memory arrays, wherein the plurality of commands is a combined group of commands with each command of the plurality being associated with a respective one of the plurality of independent memory arrays;
activating, via transitioning from a first level to a second level, of a signal output by a pin of the interface upon a command of the plurality of commands being executed only on one of the plurality of independent memory arrays; and
deactivating, via transitioning from the second level to the first level, of the signal output by the pin of the interface upon a command of the plurality of commands being executed only on the cache.

9. The method of claim 8, wherein the method includes strobing information associated with the signal output by the pin of the interface while the pin is activated.

10. The method of claim 9, wherein the method includes strobing the information using an additional pin of the interface.

11. The method of claim 9, wherein strobing the information includes synchronizing data values included in the signal output by the pin.

12. The method of claim 8, wherein an amount of time needed to execute each respective one of the plurality of commands depends on whether that respective command is executed on the cache or on one of the plurality of independent memory arrays.

13. The method of claim 8, wherein the method includes storing, in a register of the memory device, an order in which the plurality of commands are communicated to the memory device from the controller.

14. A memory system, comprising:
a memory device having a plurality of independent memory arrays;
a controller; and
an interface configured to communicate a plurality of commands from the controller to the memory device, wherein the plurality of commands is a group of combined commands with each command of the group being associated with a respective one of the plurality of independent memory arrays, and wherein the interface includes a pin configured to:
activate, via transitioning of a signal from a first level to a second level, upon a command of the plurality of commands being executed on one of the plurality of independent memory arrays;
provide information, while activated, to the controller to reschedule execution of the command using the information; and
deactivate, via transitioning of the signal from the second level to the first level, upon the command being executed according to the rescheduled execution of the command.

15. The memory system of claim 14, wherein:
the memory device includes a cache configured to store data that is also stored in the plurality of independent memory arrays; and
the command is executed on the cache according to the rescheduled execution of the command.

16. The memory system of claim 14, wherein each respective one of the plurality of commands have a non-fixed access timing associated therewith.

17. The memory system of claim 14, wherein the interface is configured to output data associated with the plurality of commands from the memory device to the controller upon the pin deactivating.

18. The memory system of claim 14, wherein the information is associated with an expected latency of the execution of the command.

19. The memory system of claim 18, wherein the information associated with the expected latency of the execution of the command includes:
information indicating a type of the command; and
information indicating when the execution of the command will be complete.

* * * * *